US 9,582,056 B2

(12) United States Patent
Hansson et al.

(10) Patent No.: US 9,582,056 B2
(45) Date of Patent: Feb. 28, 2017

(54) METHOD FOR AMPLIFYING A SIGNAL AND AMPLIFYING DEVICE (71) Applicant: Axis AB, Lund (SE)

(72) Inventors: Carl Hansson, Trelleborg (SE); Henrik Dunér, Genarp (SE)

(73) Assignee: Axis AB, Lund (SE)

( * ) Notice: Subject to any disclaimer, the term of this patent is extended or adjusted under 35 U.S.C. 154(b) by 0 days.

(21) Appl. No.: 15/015,320

(22) Filed: Feb. 4, 2016

(65) Prior Publication Data
US 2016/0231794 A1    Aug. 11, 2016

(30) Foreign Application Priority Data

Feb. 6, 2015  (EP) ..................................... 15154138

(51) Int. Cl.
*G06F 1/26* (2006.01)
*G06F 1/28* (2006.01)
(Continued)

(52) U.S. Cl.
CPC ................ *G06F 1/28* (2013.01); *G06F 1/266* (2013.01); *H03F 1/0222* (2013.01); *H03F 3/181* (2013.01); *H04L 12/10* (2013.01); *H04L 12/2838* (2013.01); *H04L 12/40045* (2013.01); *H03F 2200/03* (2013.01); *H03F 2200/511* (2013.01)

(58) Field of Classification Search
CPC .......... G06F 1/28; G06F 1/266; H03F 1/0222; H03F 3/181; H03F 2200/03; H03F 2200/511; H04L 12/10; H04L 12/2838; H04L 12/40045
See application file for complete search history.

(56) References Cited

U.S. PATENT DOCUMENTS 9,209,767 B1 * 12/2015 Svendsen .............. H03F 1/0227
2004/0258257 A1   12/2004 Hupp
(Continued)

FOREIGN PATENT DOCUMENTS

EP    2 197 105 A1    6/2010
EP    2 744 103 A1    6/2014
EP    2 819 344 A1    12/2014

OTHER PUBLICATIONS

"Audio Amplifier Powered Over Ethernet"; Karl Johan Hultin; Chalmers University of Technology; Department of Computer Science and Engineering; Göteborg, Sweden (Jan. 2013).
(Continued)

*Primary Examiner* — Mark Connolly
(74) *Attorney, Agent, or Firm* — Volpe and Koenig, P.C.

(57) ABSTRACT

The present invention relates to a method for amplifying a signal in an amplifying device, and in particular to a method for an amplifying device being adapted for a plurality of available powers. The method comprises determining an available power by retrieving a value indicating an available power, the available power being one of the plurality of available powers, setting an operating voltage level for a power amplifier, the operating voltage level being based on the available power, generating a pre-amplified signal by applying a signal gain to the signal, the signal gain being based on the available power, and generating an output signal by amplifying the pre-amplified signal at the power amplifier.

15 Claims, 3 Drawing Sheets (51) Int. Cl.
*H03F 1/02* (2006.01)
*H03F 3/181* (2006.01)
*H04L 12/28* (2006.01)
*H04L 12/40* (2006.01)
*H04L 12/10* (2006.01)

(56) References Cited

U.S. PATENT DOCUMENTS

| | | |
|---|---|---|
| 2005/0044431 A1 | 2/2005 | Lang et al. |
| 2010/0157498 A1 | 6/2010 | Skov et al. |
| 2016/0087446 A1* | 3/2016 | Zainaldin ................ H04L 12/10 307/104 |

OTHER PUBLICATIONS

EP 15 15 4138.0 European Search Report (Aug. 7, 2015).

* cited by examiner

METHOD FOR AMPLIFYING A SIGNAL AND AMPLIFYING DEVICE

FIELD OF INVENTION

The present invention relates to a method for amplifying a signal in an amplifying device, and in particular to a method for an amplifying device being adapted for a plurality of available powers. The present invention further relates to such amplifying device.

BACKGROUND

Power over Ethernet (PoE) is a technology which enables power transmission through Ethernet cabling. There are several techniques for implementing PoE and IEEE 802.3af or IEEE 802.3at is two examples of standards for implementing PoE. In the IEEE standards there are two modes or alternatives for implementing PoE, one where the power is transmitted on unused conductors of the Ethernet cable and one where the power is transmitted on conductors also used for transmitting data. This allows a single Ethernet cable to provide both data connection and electrical power to powered devices (PD). In other words, when the PD is provided with PoE, the PD can be connected to the cables to work normally without coupling to a separate power socket. The above-mentioned function of PoE is very convenient. However, depending on the PoE standard used, and also depending on the type of power source equipment (PSE) used for delivering the power over the cables, a plurality of different input powers (PoE classes) may be available for the PD.

An example of a PD is an amplifying device for increasing the power of a signal, e.g. an audio signal. Normally, such an amplifying device is configured for a certain input power, e.g. 40W or 25W. If an amplifying device that is configured for an input power of 40W is fed with 25W, the signal quality will be affected and the user will not be able to control the output signal in an intuitive way with a control interface. This implies that different product versions of the amplifying device are needed for each PoE class to match the available input power.

This is inconvenient for the manufacturer of such PD:s, since a plurality of product versions are needed in order to support different classes of PoE. Moreover, it is inconvenient for the user of the PD, since the user needs to be aware of what PoE-class that is delivered from the PSE of his/hers network infrastructure.

SUMMARY

In view of the above, an objective of the invention is to solve or at least reduce one or several of the drawbacks discussed above. Generally, the above objective is achieved by the attached independent patent claims.

According to a first aspect, the present invention is realized by a method for amplifying a signal in an amplifying device, the amplifying device being adapted for a plurality of available powers, comprising the steps of: determining an available power by retrieving a value indicating an available power, the available power being one of the plurality of available powers, setting an operating voltage level for a power amplifier, the operating voltage level being based on the available power, generating a pre-amplified signal by applying a signal gain to the signal, the signal gain being based on the available power, and generating an output signal by amplifying the pre-amplified signal at the power amplifier.

The available powers may correspond to different classes of PoE, e.g. the amplifying device may be adapted for PoE class 3 which corresponds to a power of 13-14 W and PoE class 4 which corresponds to a power of 25W. The available powers may comprise any other suitable class of PoE. Moreover, the available powers may comprise other magnitudes of power, such as 40W or 20W or higher levels of power in non-standard versions of PoE.

The signal to be amplified may be sound signals, e.g. received as data signals over a network. In that case, the amplifying device may be connected to a speaker for rendering the output signal. The amplifying device could however also be connected to other devices such as heaters, illumination sources or other devices, whereby the input signal is a signal with a content suitable for such a connected device.

By setting the operating voltage level for the power amplifier based on the available power, the power loss inside the amplifying device may be reduced. This embodiment is thus also beneficial for environmental reasons and/or for power efficiency since unnecessary power losses may be avoided.

Moreover, by basing both the signal gain and the operating voltage level on the available power, the risk of clipping to occur in the amplifying device is reduced. Clipping is a form of waveform distortion that occurs when an amplifying device is overdriven and attempts to deliver an output voltage beyond its maximum capability. In other words, in order to reduce the risk of clipping, the overall level of the pre-amplified signal, which is controlled by the signal gain, needs to be coordinated with the available operating voltage of the power amplifier.

By providing an amplifying device which amplifies the input signal according to the above, the amplifying device will be adapted for a plurality of available powers. This in turn makes the amplifying device easier to use for an end-user, since the amplifying device is configured to discover what the available power is, and automatically configure itself according to the available power. This may reduce the need of physical device configuration or end-user intervention when installing the amplifying device. Moreover, the need of providing a variety of different amplifying devices from a manufacturer may be reduced.

According to some embodiments, the step of setting an operating voltage level comprises looking up the available power in a predefined look up table, the look up table specifying an operating voltage level for each of the plurality of available powers. This is a simple and fast operation for determining the operating voltage level to be used for feeding the power amplifier.

According to some embodiments, the step of generating the pre-amplified signal comprises: generating a temporary pre-amplified signal by applying a first signal gain to the signal, the first signal gain being a based on a ratio between the available power and a highest available power ($P_{max}$) among the plurality of available powers for which the amplifying device is adapted. The method further comprising generating the pre-amplified signal by applying a second signal gain to temporary pre-amplified signal, the second signal gain being based on a ratio between the available power and a highest available power ($P_{max}$) among the plurality of available powers.

By dividing the pre-amplification in two steps according to above, the pre-amplification can easily be distributed over available components in the amplifying device, e.g. the pre-amplification may be performed partly in a codec component and partly in the power amplifier. Consequently, no extra circuit for providing pre-amplification based on the available power is needed. This may simplify the manufacturing process of the amplifying device, which is beneficial for manufacturing cost reasons.

According to some embodiments, the signal is a digital signal. In this case the method further comprises the step of: converting the digital signal into an analog signal. The signal gain may then also be based on a maximum allowed voltage of the analog signal. The conversion between the digital signal and the analog signal is done in a codec, and the maximum allowed voltage of the analog signal is a specified property in the codec used for the conversion.

According to some embodiments, the method further comprises the step of retrieving a gain level from one of: a memory and a user input, wherein the signal gain is further based on the retrieved gain level. The gain level may be expressed in percentage, e.g. 65%. This means that the signal gain may be 65% of the maximum signal gain for the available power. By using a gain level retrieved from memory, an overall level of the output signal may be the same after start up of the amplifying device as it was prior to turning off the amplifying device. Moreover, by retrieving a gain level from a user input, the user may advantageously control the overall level for the output signal. Further, by also taking the available power into account when determining the signal gain, clipping may be avoided as mentioned above, even if the available power is lower after start up of the amplifying device compared to prior to when it was turned off.

According to some embodiments, the method further comprises the step of storing a settings value in the memory, the settings value comprising a gain level value indicative of the retrieved gain level and an available power value indicative of the available power. Storing the available power value indicative of the available power in the memory facilitates comparison between the available power when the settings value was stored in memory and the available power when the gain level is retrieved from memory. Moreover, by storing the setting value in the memory, a changed gain level retrieved from a user input may be directly stored in memory for later use (e.g. after restart of the amplifying device). This embodiment further facilitates that the step of retrieving the gain level may comprise: retrieving a previously stored settings value from the memory, and using the gain level value from the retrieved settings value as the gain level.

According to some embodiments, the step of retrieving the gain level comprises: retrieving a previously stored settings value from the memory, comparing the available power value in the retrieved settings value with the available power, and if the available power value in the retrieved settings value equals the available power, using the gain level value from the retrieved settings value as the gain level, and if the available power value in the retrieved settings value do not equal the available power, using a default gain level as the gain level.

By only using the stored gain level value as the gain level if the available power has not changed since the retrieved setting value was stored in memory, an unexpected high or low overall level of the rendered output signal, e.g. from the speaker device, may be avoided.

According to some embodiments, the method further comprises the steps of: retrieving a previously stored settings value from the memory, comparing the available power value in the retrieved settings value with the available power, and notifying a user if the available power value in the retrieved settings value differs from the available power.

Such a notification may thus be generated to the user of the amplifying device if a new available power other than the power that was available (e.g. before a restart of the amplifying device) has been detected. This is an advantageous functionality since, as described above, the available power in combination with the retrieved gain level will govern the overall level of the output signal. For example, if the amplifying device, prior to a restart, was fed with a low power and gain level was set to 90%, upgrading the PoE class (i.e. feeding a higher power to the amplifying device) without adjusting the gain level could cause damages to a speaker as well as inconvenience to persons close to the speaker.

According to some embodiments, the user is only notified if the available power value in the retrieved settings value is lower than the available power.

According to some embodiments, the step of retrieving a gain level comprises: receiving a user input pertaining to a desired gain level, and using the desired gain level as the gain level.

According to some embodiments, the method is performed at start up of the amplifying device. As described above, the available power may have changed after a start up compared to prior the start up. Moreover, by performing the method at start up, any stored gain level may be used for determining the signal gain directly at start up.

In a second aspect, the present invention provides a computer program product comprising a computer-readable storage medium with instructions adapted to carry out the method of the first aspect when executed by a device having processing capability.

In a third aspect, the present invention provides an amplifying device being adapted for a plurality of available powers, the amplifying device comprising: an internal power supply configured to: determine an available power by retrieve a value indicating an available power, the available power being one of the plurality of available powers, and set an operating voltage level for a power amplifier, the operating voltage level being based on the available power. The amplifying device further comprises a processor configured to determine a signal gain based on the available power, and a pre-amplifier configured to generate a pre-amplified signal by applying the signal gain to the signal, wherein the power amplifier is configured to generate an output signal by amplifying the pre-amplified signal.

The amplifying device may according to some embodiments be connected to a power over Ethernet, PoE, power sourcing equipment, PSE.

The second and third aspect may generally have the same features and advantages as the first aspect.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, where the same reference numerals will be used for similar elements, wherein.

DETAILED DESCRIPTION OF THE PREFERRED EMBODIMENTS

Figure 1:
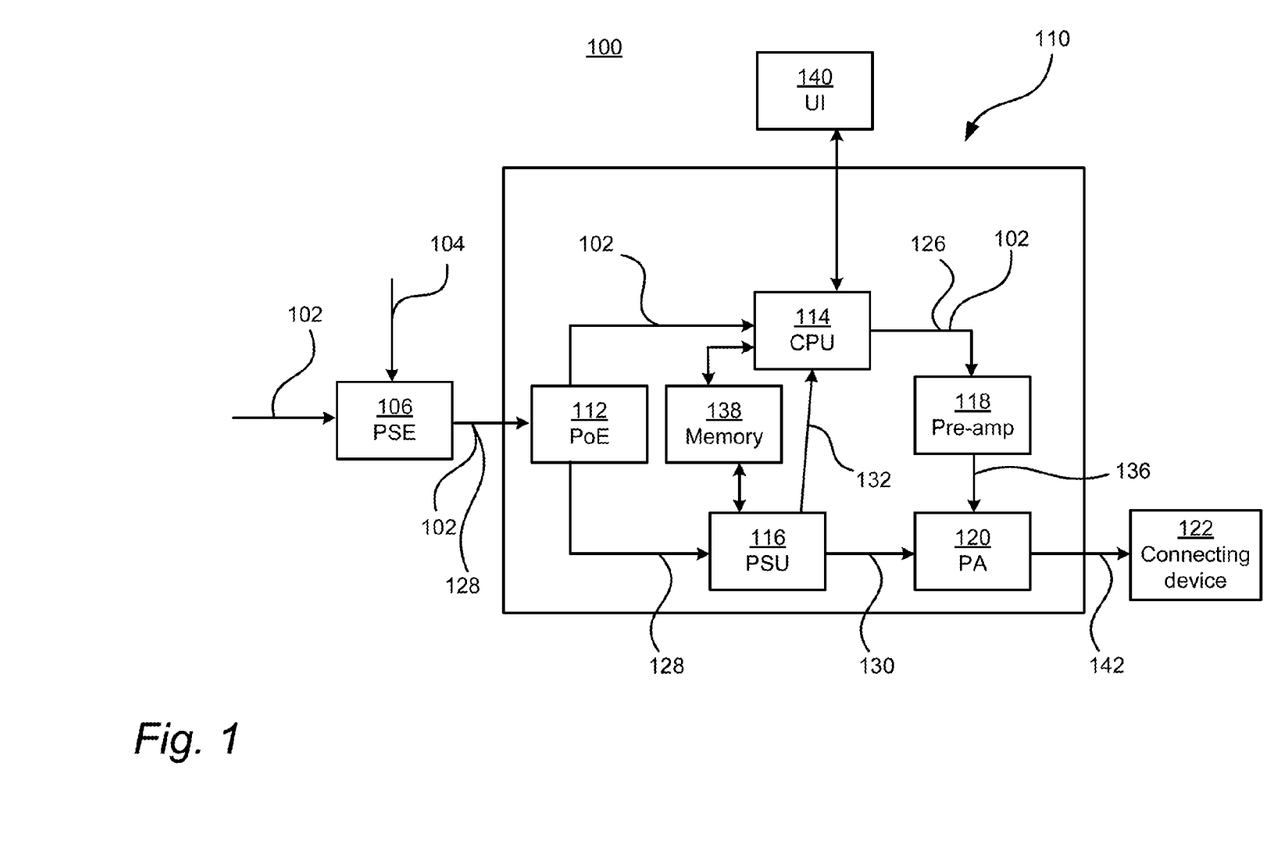
FIG. 1 schematically describe an amplifying device according to embodiments of the invention, FIG. 2 schematically describe an amplifying device according to embodiments of the invention, FIG. 3 show a flow chart of a method for amplifying a signal in an amplifying device according to embodiments of the invention.
Figure 2:
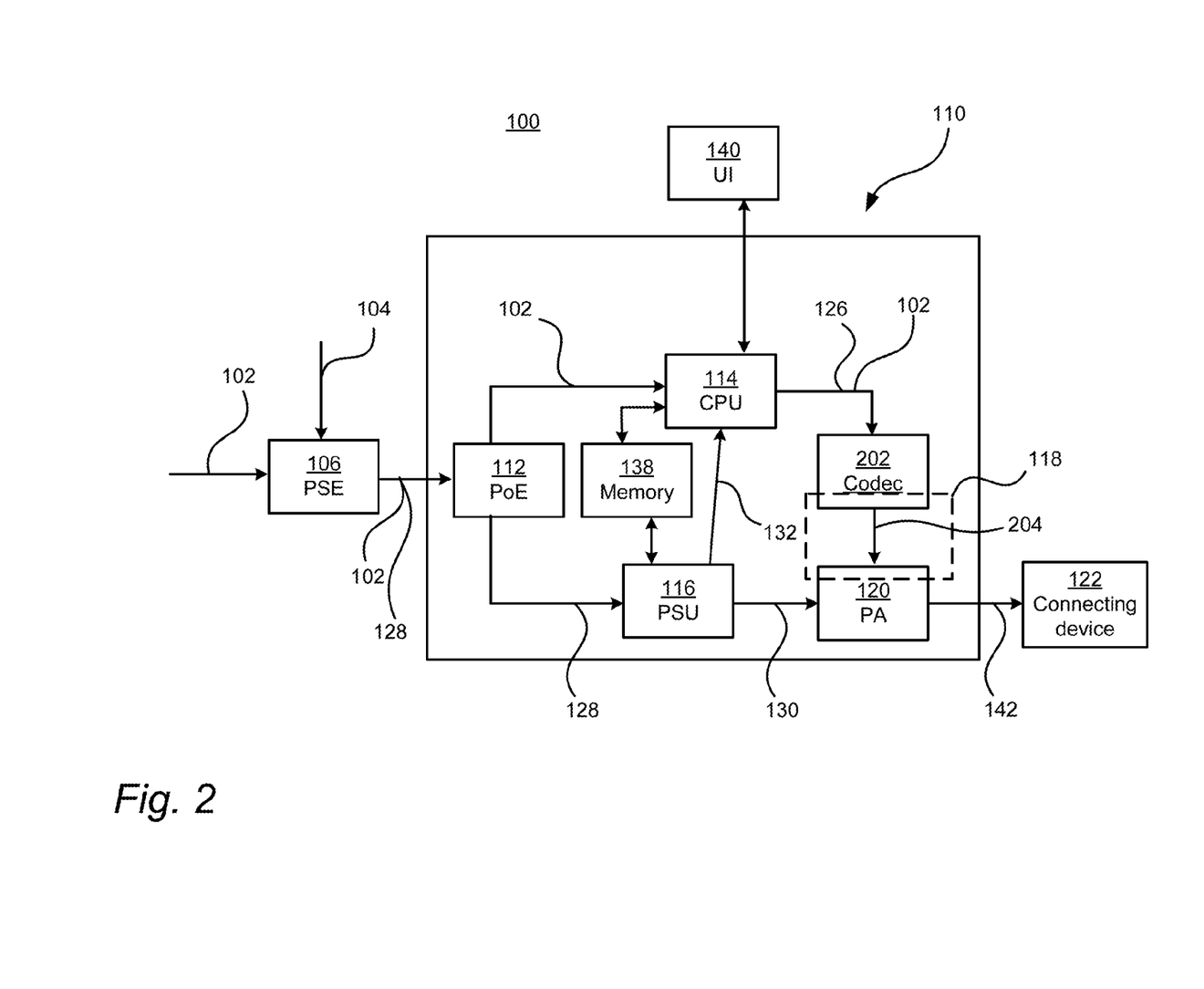
Figure 3:
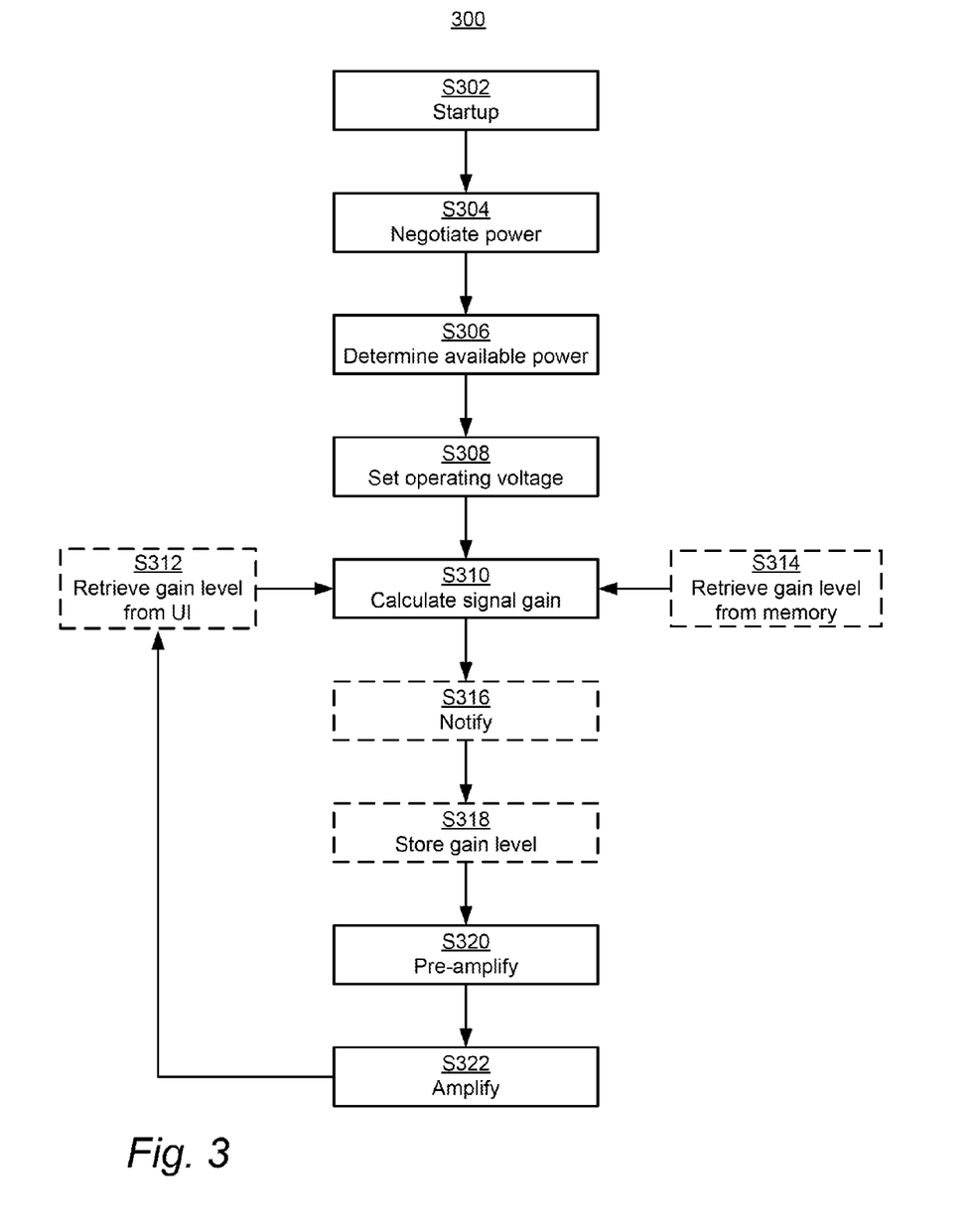

An amplifying device adapted for a plurality of available powers and the functionality of such amplifying device will now be explained in conjunction with FIGS. 1-3. FIG. 1-2 can schematically describe two embodiments of such amplifying device while FIG. 3 describe by way of example a flow chart of a method for amplifying a signal in the amplifying device of FIGS. 1-2.

FIG. 1 schematically shows a system 100 comprising a Power over Ethernet, PoE, power sourcing equipment, PSE 106, an amplifying device 110 and a device 122 connected to the amplifying device. The amplifying device 110 is connected to and powered by the PSE 106. It should be noted that the amplifying device 110 described in conjunctions with FIGS. 1 and 2 is exemplified as being connected to the PSE 106, but any other suitable type of power source could be connected to the amplifying device 110 such as a USB power source.

The PSE 106 is connected to a cable providing the power 104. An available power for powering the amplifying device 110 is thus dependent on the network infrastructure of the system 100. Depending on the PoE standard used in the system 100, and also depending on the type of PSE for delivering the power over the cables, any powers up to e.g. 50 Watts may be available for powering the amplifying device 110. Other power levels may of course also be used, e.g. based on non-standard technologies.

In order to determine S306 an available power (referred to as 128 in FIG. 1 and FIG. 2), the amplifying device 110 is retrieving a value indicating the available power. This may is preceded by a negotiating phase S304 between the amplifying device 110 and the PSE 106. The PSE 106 may for example detect if the amplifying device 110 is PoE enabled and which class(es) of PoE that the amplifying device can handle. This detection may be implemented as disclosed in section 2.1.3 of "Audio amplifier powered over Ethernet" (HULTIN) or according to any of the IEEE 802.3af or IEEE802.3at standards. Such negotiating of what level of power to use is advantageously performed at start up S302 of the amplifying device. This means that if the network infrastructure of the system 100 has changed, e.g. if the amplifying device 110 has been moved to another building during the time that the amplifying device 110 has been powered down, this is detected directly at startup S302 of the amplifying device 110.

The PSE 106 may then operate in the highest PoE class that both the PSE 106 and the amplifying device 110 can handle. The PSE 106 is also indicating, e.g. via Ethernet cabling, to the amplifying device 110 what power the PSE 106 will operate in, i.e. the available power 128. This is achieved using a classification procedure defined by the communication protocol used, e.g. as specified by the IEEE 802.3af or IEEE802.3at standards or specified in the used USB power supply standard.

The PSE 106 is further connected to a cable providing a signal 102 to be amplified. This type of PSE is called a midspan. Midspans are power injectors that stand between a regular Ethernet switch and the powered device (e.g. the amplifying device 110), injecting power 104 without affecting the signal 102 to be amplified. It should be noted that an endspan also could be employed; replacing the midspan 106 in FIG. 1. The PSE will combine the signal 102 to be amplified and available power 128 and transmit the resulting combination to the amplifying device 110 over the Ethernet cabling. The signal 102 to be amplified may be transmitted on some of the conductors in the cable while the available power 128 is transmitted on the remaining conductors in the cable. Alternatively, the available power 128 may be transmitted on the same conductors as the signal 102 to be amplified. The alternatives used depend on the configuration of the PSE.

The combination of the signal 102 to be amplified and the power 104 is thus transmitted via the cabling and received by a PoE input circuit 112. The PoE input circuit 112 may yet again separate the signal 102 to be amplified from the available power 128.

In order to reduce the need of having a different version of the amplifying device for each possible available power, it is advantageous to adapt the amplifying device 110 for a plurality of available powers. This is done by adapting the internal operations of the amplifying device 110 according to the determined available power 128. The amplifying device 110 according to this embodiment is set up such that an operating voltage level 130 for a power amplifier 120 of the amplifying device 110 and also a signal gain 126 for generating a pre-amplified signal 136 is based on the available power. This will be explained in the following.

The amplifying device comprises an internal power supply (PSU) 116. The PSU 116 is connected to a power amplifier (PA) 120 and is configured to set S308 an operating voltage level 130 for the PA 120 based on the available power 128. The PA 120 is an electronic amplifier that amplifies low-power signals to be amplified to a suitable level for the connecting device 122. In the case of an audio signal to be amplified, the PA 120 amplifies low-power audio signals to a level suitable for driving loudspeakers.

The internal power supply may e.g. convert an available power 128 of 13-14W to a voltage level 130 of approximately 8V, an available power 128 of 25W to a voltage level 130 of approximately 15V and an available power 128 of 40W to a voltage level 130 of approximately 20V. According to some embodiments, the operating voltage level 130 is determined by looking up the available power in a predefined look up table. The look up table may specify an operating voltage level for each of the plurality of available powers. The look up table may be stored in a memory 138 of the amplifying device 110. Consequently, the PSU may be able to communicate with the memory 138.

The PSU is further connected to the processor (CPU) 114. This means a circuit in the PSU has the ability to communicate a value 132 indicating a level of the available power, or the operating voltage level, to the CPU, which then can use this information for further adapting the amplifying device 110 according to the available power. For this reason, the CPU 114 is configured to determine S310 a signal gain 126 based on the available power. The signal gain 126 is communicated to a pre-amplifier 118 which is configured to generate S320 a pre-amplified signal 136 by applying the signal gain 126 to the signal 102 to be amplified. The calculation of the signal gain 126 and the generation S320 of the pre-amplified signal 136 will be further discussed below. The pre-amplified signal 136 may be a low-power signal of 0.5-1 V in Root Mean Square Voltage, $V_{rms}$.

The pre-amplified signal 136 is then amplified S322 by the PA 120 which generated an output signal 142. Depending on the operating voltage 130 of the PA 120, the output signal 142 may have $V_{rms}$ of 5-10V. Since the signal gain 126 used for the pre-amplification S320 is coordinated with the operating voltage level 130 of the PA 120, the risk of clipping of the output signal 142 is reduced. If no such coordination would exist, e.g. if the pre-amplifier 118 always was configured for an high available power (e.g. 40W), the pre-amplifier 118 would, in the case of a lower available power, generate a pre-amplified signal with too high $N_{rms}$ which in turn would push the PA 120 to create an output signal 142 with more power than its PSU 116 can produce. This means that the PA 120 would amplify S322 the pre-amplified signal 136 only up to its maximum capacity, at which point the pre-amplified signal 136 can be amplified no further. The extra signal which is beyond the capability of the PA 120 is simply cut off, resulting in a sine wave becoming a distorted square-wave-type waveform. This distortion is called "clipping".

On the other hand, if the pre-amplifier 142 always was configured for a low available power (e.g. 13W), and a higher available power was transmitted to the amplifying device 110 and in turn converted to a high operating voltage level, the maximum level of the output signal 142 would be lower than what should be possible considering the available power. Moreover, the power loss inside the amplifying device 110 would be unnecessary high. For example, the power loss inside an amplifying device wherein the operating voltage level of the PA is based on an available power of 10W may be 3W, while the power loss inside an amplifying device wherein the operating voltage level of the PA is based on an available power of 5W may be 1W.

The output signal 142 may then be transmitted to the connecting device (e.g. the speaker, heater, illumination source etc.) for further use.

For some applications, it may be advantageous that the signal gain 126 is based on further information, e.g. such that the signal gain 126 is a percentage value (or gain level) of the maximum signal gain (which is calculated using the available power as described above). This gain level may be retrieved S312 from a user input. In other words, the gain level may be set S312 from a user input. The amplifying device 110 may thus be connected to a user interface (UI) 140 for retrieving S312 such user input, e.g. a graphical user interface (GUI) or physical push buttons for adjusting the amplification (volume buttons). The UI 140 may be provided remotely from the amplifying device 110 or it may be provided on the amplifying device 110.

Alternatively, or additionally, the gain level may be retrieved S314 from the memory 138. In other words, the gain level may be set S314 from the memory 138. For this reason, the amplifying device may be configured for storing S318 the gain level in the memory 138, for example every time the signal gain 126 is calculated S310. The amplifying device may alternatively or additionally be configured to store S318 the gain level by request from a user by means of the UI 140. By adding the functionality of retrieving S312 the gain level from the memory 138 and storing S318 the gain level in memory 138, the previously used gain level may be remembered when the amplifying device 110 is turned off and then turned on again. However, this functionality may cause problems if the same gain level is used before the amplifying device 110 is turned off and after the amplifying device 110 is turned on again, while the available power 128 has changed. For example, if the amplifying device 110 is used to for amplifying audio signals, using a higher available power while keeping the same gain level will mean an increased Vim, of the output signal 142. This may not be desired, since the speaker 122 connected to the amplifying device can be damaged, and also since an inconveniently loud audio signal may be rendered by the speaker 122. In order to reduce the risk of this to happen, a setting value may be stored S318 in the memory 138, wherein the settings value comprises a gain level value indicative of the retrieved S312, S314 gain level and an available power value indicative of the available power 128. The step of retrieving S314 the gain level from the memory will then comprise retrieving a previously stored settings value from the memory 138 and using the gain level value from the retrieved settings value as the gain level. The settings value may optionally comprise further values such as timestamps, user names etc.

By also storing the available power value in the memory, this information can be used when calculating S310 the signal gain 126. According to some embodiments, the step of retrieving S314 the gain level from the memory comprises retrieving a previously stored settings value from the memory. The available power value in the retrieved settings value may then be compared to the available power 128. If the comparison results in that the available power value in the retrieved settings value equals the available power 128, the gain level value from the retrieved settings value may be used as the gain level. However, if the comparison results in that the available power value in the retrieved settings value do not equals the available power, a default gain level may be used as the gain level. This may reduce the risk of damaging the connecting device 122 in case the available power has increased since the settings value was stored in the memory 138.

The UI 140 may also be designed to notify S316 a user of the amplifying device 110, for example if the available power value in the retrieved settings value differs from the available power. The notification depends on the UI 140, and could comprise e.g. flashing of light, playing a sound, or a message shown in a GUI. A user could also be notified through an e-mail, a text message to a mobile telephone etc. This way, a user of the amplifying device 110 may be notified S316 if the available power 128 has changed, which may be unexpected or otherwise worth knowing for the user. According to some embodiments, the user is only notified S316 if the available power value in the retrieved settings value is lower than the available power 128, e.g. when the available power has increased since it was last stored.

As described above, the signal gain 126 is thus calculated based on the available power 128 and optionally also based on the gain level. According to some embodiments, the signal gain 126 comprises a first and a second signal gain. The first signal gain $G_1$ may be calculated based on a ratio between the available power 128 ($P_{out}$) and a highest available power among the plurality of available powers.

$$G_1 = 20 \log\left(\frac{P_{out}}{P_{max}}\right).$$

The first signal gain may thus correspond to a negative dB for all levels of available power below the max available power ($P_{max}$) of the plurality of available powers that the amplifying device 110 is adapted for.

The second signal gain $G_2$ may then be a predefined signal gain, i.e. not based on the available power 128. For example, the second signal gain may correspond to a signal gain that corresponds to the max available power of the plurality of available powers that the amplifying device 110 is adapted for. The second signal gain may be calculated as follows:

$$P_{max} = \frac{U^2}{R}$$

where $P_{max}$ is the max available power of the plurality of available powers that the amplifying device 110 is adapted for, e.g. 40W, and R corresponds to an impedance of the connected device. Then the second signal gain $G_2$ can be calculated by:

$$G_2 = dB\left(\frac{U}{U_{max}}\right)$$

where $U_{max}$ corresponds to a maximum allowed voltage of the signal 102 to be amplified.

If $P_{max}=40W$, $R=8\Omega$ and $U_{max}=0.909V$, the second signal gain $G_2$ will be 26 dB.

With the example values above, the total gain $G_1+G_2$ will be:

| $G_1 + G_2$ | $P_{out}$ |
|---|---|
| 26 dB | 40 W |
| 23 dB | 20 W |
| 19 dB | 7 W |

FIG. 2 show by way of example an amplifying device 110 used for amplifying digital signals. The embodiment shown in FIG. 2 comprises the mostly the same components as the embodiment shown in FIG. 1. However, the pre-amplifier 118 is distributed between two different components of the amplifying device 110, it is distributed between a codec 202 and the PA 120. The codec 202 converts the digital signal 102 into an analog signal 204 and at the same time applies the first signal gain to the analog signal. The PA 202 then applies the second signal gain to the analog signal 204 which then forms the pre-amplified signal. The second signal gain is based on a maximum allowed voltage of the analog signal ($U_{max}$, see above); this value is specified by the codec 202. The PA 202 then generates an output signal 142 by amplifying S322 the pre-amplified signal.

During amplification of the signal 102 to be amplified, the user may, via the UI 140, set a new gain level S312. This will then, as shown in FIG. 3, result in that a new signal gain 126 is calculated S310. The new gain level may optionally be stored S318 in the memory 138, optionally overwriting any previously stored gain levels. The new gain level is then used for pre-amplifying S320 the signal 102 to be amplified, and the pre-amplified signal is then amplified S322 by the PA 120 and the resulting output signal 142, having a new overall level, is sent to the connecting device 122.

The person skilled in the art realizes that the present invention by no means is limited to the order of the steps in the exemplary embodiment of the method described above in conjunction with FIG. 3. On the contrary, variations are possible within the scope of the appended claims The step of storing S318 a gain level may for example be performed directly after the step of calculating S310 the signal gain 126.

Additionally, variations to the disclosed embodiments can be understood and effected by the skilled person in practicing the claimed invention, from a study of the drawings, the disclosure, and the appended claims. For example, in the case the stored setting value comprises a timestamp; the amplifying device 110 may be configured to only use the gain level from the settings value in case the time period that has passed since the setting value was stored is less than a threshold.

What is claimed is:

1. A method for amplifying a signal in an amplifying device, the amplifying device being adapted for a plurality of available powers, comprising:
   determining an available power by retrieving a value indicating an available power, the available power being one of the plurality of available powers;
   setting an operating voltage level for a power amplifier, the operating voltage level being based on the available power;
   generating a pre-amplified signal by applying a signal gain to the signal, the signal gain being based on the available power; and
   generating an output signal by amplifying the pre-amplified signal at the power amplifier.

2. The method according to claim 1, wherein the setting an operating voltage level comprises looking up the available power in a predefined look up table, the look up table specifying an operating voltage level for each of the plurality of available powers.

3. The method according to claim 1, wherein the generating the pre-amplified signal comprises generating a temporary pre-amplified signal by applying a first signal gain to the signal, the first signal gain being based on a ratio between the available power and a highest available power among the plurality of available powers, and generating the pre-amplified signal by applying a second signal gain to temporary pre-amplified signal, the second signal gain being a predefined signal gain.

4. The method according to claim 1 further comprising converting the signal into an analog signal, wherein the signal is a digital signal, wherein the signal gain is further based on a maximum allowed voltage of the analog signal.

5. The method according to claim 1 further comprising retrieving a gain level from one of a memory and a user input, wherein the signal gain is further based on the retrieved gain level.

6. The method according to claim 5, further comprising storing a settings value in the memory, the settings value comprising a gain level value indicative of the retrieved gain level and an available power value indicative of the available power.

7. The method according to claim 6, wherein the retrieving the gain level comprises retrieving a previously stored settings value from the memory and using the gain level value from the retrieved settings value as the gain level.

8. The method according to claim 6, wherein the retrieving the gain level comprises retrieving a previously stored settings value from the memory, comparing the available power value in the retrieved settings value with the available power, and, if the available power value in the retrieved settings value equals the available power, using the gain level value from the retrieved settings value as the gain level, and, if the available power value in the retrieved settings value do not equal the available power, using a default gain level as the gain level.

9. The method according to claim 6, further comprising:
   retrieving a previously stored settings value from the memory;
   comparing the available power value in the retrieved settings value with the available power; and notifying a user if the available power value in the retrieved settings value differs from the available power.

10. The method according to claim 9, wherein the user is only notified if the available power value in the retrieved settings value is lower than the available power.

11. The method according to claim 5, wherein the retrieving a gain level comprises receiving a user input pertaining to a desired gain level and using the desired gain level as the gain level.

12. The method according to claim 1, wherein the method is performed at start up of the amplifying device.

13. A computer program product comprising a computer-readable storage medium with instructions adapted to carry out the method of claim 1, when executed by a device having processing capability.

14. An amplifying device being adapted for a plurality of available powers, the amplifying device comprising:

an internal power supply configured to:
  determine an available power by retrieve a value indicating an available power, the available power being one of the plurality of available powers; and
  set an operating voltage level for a power amplifier, the operating voltage level being based on the available power;
a processor configured to determine a signal gain based on the available power; and
a pre-amplifier configured to generate a pre-amplified signal by applying the signal gain to the signal, wherein the power amplifier is configured to generate an output signal by amplifying the pre-amplified signal.

15. The amplifying device according to claim 14, being connected to a Power over Ethernet (PoE) power sourcing equipment (PSE).

* * * * *